United States Patent [19]

Grebene

[11] 3,869,679

[45] Mar. 4, 1975

[54] PHASE LOCKED LOOP WITH LIMITED TRACKING RANGE

[75] Inventor: Alan B. Grebene, Saratoga, Calif.

[73] Assignee: Signetics Corporation, Sunnyvale, Calif.

[22] Filed: Jan. 28, 1974

[21] Appl. No.: 437,148

Related U.S. Application Data

[60] Division of Ser. No. 381,041, July 20, 1973, abandoned, which is a division of Ser. No. 283,555, Aug. 24, 1972, abandoned, which is a continuation of Ser. No. 105,538, Jan. 11, 1971, abandoned.

[52] U.S. Cl. .......................... 331/8, 331/25, 331/34, 331/113 R, 331/177 R

[51] Int. Cl. .......................... H03b 3/04, H03k 3/282

[58] Field of Search ......... 331/8, 18, 25, 34, 113 R, 331/177 R

[56] References Cited

UNITED STATES PATENTS

| | | | |
|---|---|---|---|
| 3,249,893 | 5/1966 | Castellano, Jr. | 331/8 X |
| 3,349,343 | 10/1967 | Luna et al. | 331/113 R X |
| 3,582,809 | 6/1971 | Rigby | 331/8 |

*Primary Examiner*—Siegfried H. Grimm
*Attorney, Agent, or Firm*—Flehr, Hohbach, Test, Albritton & Herbert

[57] ABSTRACT

A voltage controlled oscillator for use in a phase locked loop where the VCO includes constant current source means in addition to a current source varied by the control input signal to change the frequency of the VCO thereby providing a controlled tracking range. The constant current source means have a temperature compensating bias source which includes a bridge circuit where the bias voltage is taken from the center leg of the bridge which carries no current and thus produces no voltage level shift.

2 Claims, 5 Drawing Figures

PHASE LOCKED LOOP WITH LIMITED TRACKING RANGE

CROSS REFERENCE TO RELATED APPLICATIONS

This is a division of application Ser. No. 381,041, filed July 20, 1973, which is a division of Ser. No. 283,555, filed Aug. 24, 1972, and now abandoned, which was a continuation of Ser. No. 105,538 filed Jan. 11, 1971, and now abandoned.

BACKGROUND OF THE INVENTION

The present invention is directed to a voltage controlled oscillator (VCO) and more particularly to an integrated VCO suitable for use in a phase locked loop which is temperature stable and has an electronically controlled tracking range.

In prior voltage controlled oscillators the frequency of the output signal of the oscillator can be varied from a center frequency down to zero or to double such frequency. When used in a phase locked loop this causes the loop characteristic to have a wide tracking range. For many applications it is desirable to limit and electronically control this range.

However, even with a limited tracking range excessive drift due to temperature changes can nullify this benefit. Thus, temperature drift compensation is necessary especially when the overall circuit is in an integrated format.

OBJECTS AND SUMMARY OF THE INVENTION

It is, therefore, a general object of the invention to provide an improved voltage controlled oscillator.

It is a more specific object of the invention to provide a VCO suitable for integration and use in a phase locked loop which has a limited and electronically controlled tracking range and is temperature stable.

In accordance with the above objects there is provided a voltage controlled oscillator responsive to the magnitude of an input control signal for producing an output signal having a frequency related to such magnitude. A semiconductive substrate and multivibrator having timing capacitor means are provided. Means for varying the frequency of the output signal in response to the input control signal include variable current source means integrated in the substrate coupled to the capacitor means and responsive to the control signal for varying the magnitude of current coupled to the capacitor means. Also included are constant current source means integrated into the substrate and coupled to the capacitor.

In addition to the foregoing the present invention also provides a temperature dependent network integrated into the substrate for biasing the constant current source means.

DETAILED DESCRIPTION OF THE PREFERRED EMBODIMENT

Figure 1:
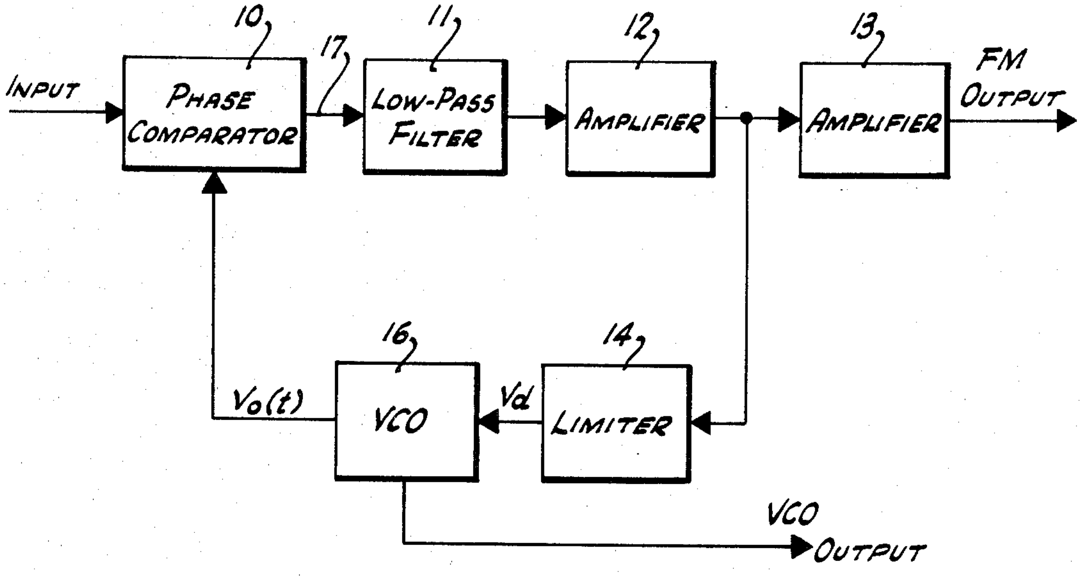
FIG. 1 is a block diagram of a phase locked loop embodying the present invention.

Referring now to FIG. 1 the block diagram illustrated shows what is termed in the art a phase locked loop. Such a system in integrated format is more fully described in a copending application in the names of Hans R. Camenzind and Alan B. Grebene, filed July 29, 1968, Ser. No. 748,349 entitled "Integrated Frequency Selective Circuit and Demodulator," assigned to the present assignee and now U.S. Pat. No. 3,564,434.

The loop consists of three basic components. A phase detector or comparator 10 is in series with a low pass filter 11 which provides an audio output signal labeled FM output. This output signal is amplified by both an amplifier 12 within the loop and a second amplifier 13. The audio output of amplifier 12 is coupled to a limiter 14. This output in turn is coupled to a voltage controlled oscillator 16 (hereinafter termed VCO). The VCO has a frequency which is related to the magnitude of the input control voltage from filter 11. VCO 16 has an output terminal for its oscillation frequency labeled VCO output and also an output, $V_0(t)$, coupled to phase comparator 10.

Phase comparator 10 compares the phase of the input signal against the phase of the VCO output signal $V_0(t)$. The output voltage of the phase comparator on line 17 is a measure of the phase difference between the two signals inputed to it. When these two signals have the same frequency then the error voltage is proportional to the phase difference. This thus provides the demodulated FM output signal. Limiter 14 as will be discussed below in greater detail provides for limiting the VCO tracking range as it relates to the phase locked loop and is an integrated portion of the VCO.

The circuit of FIG. 1 is also suitable for demodulation of AM type signals with the addition of a phase shifter circuit as disclosed and claimed in a copending application entitled "Amplitude Demodulator Using A Phase Locked Loop" in the names of Hans R. Camenzind, et al., Ser. No. 800,998 filed July 20, 1969 and assigned to the present assignee, and now U.S. Pat. No. 3,603,890.

Figure 2:
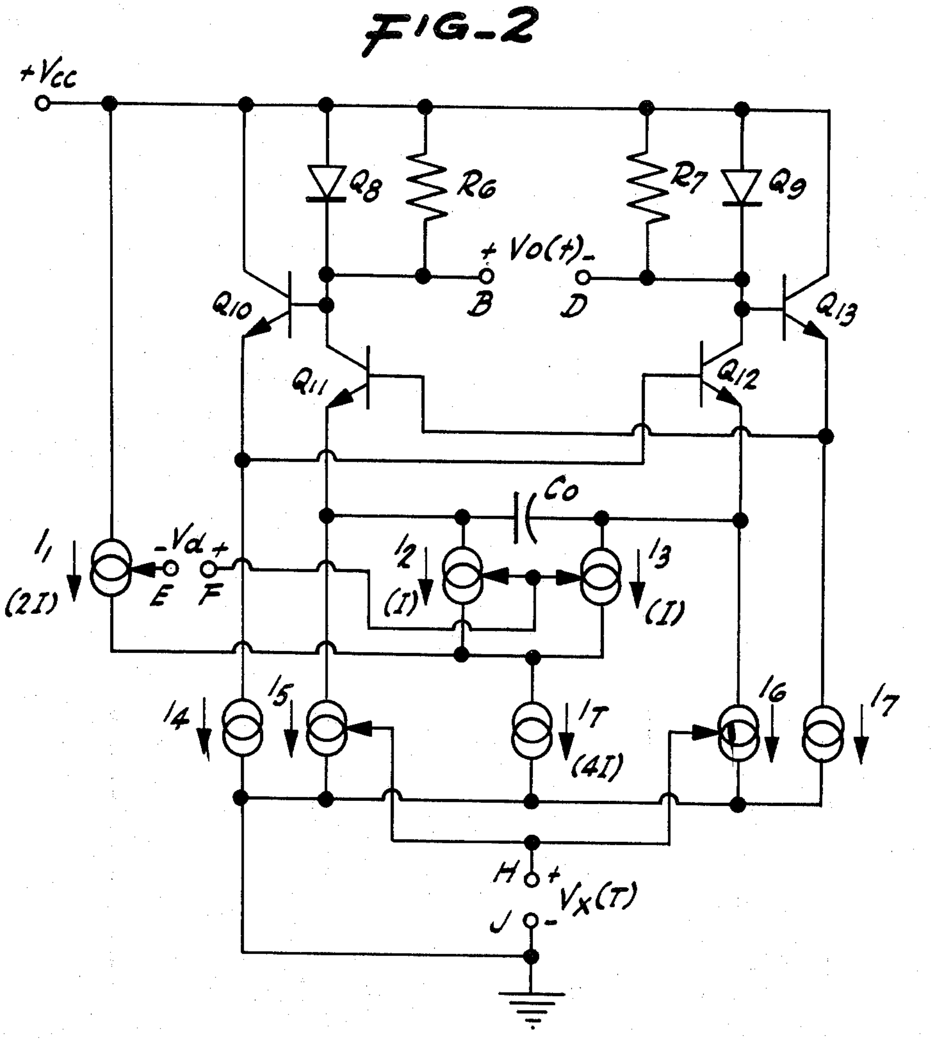
FIG. 2 is a simplified circuit diagram of a VCO which is a portion of FIG. 1.

The voltage controlled oscillator section of the phase locked loop is shown in greater detail in FIG. 2 and is designed as a non-saturating emitter coupled multivibrator. This particular choice of circuit topology is chosen because of its high frequency capability and its linear voltage to frequency conversion characteristics. FIG. 2 is, of course, a simplified circuit diagram.

The regenerative gain stage for the oscillator is formed by the transistors Q11 and Q12 which are cross coupled to the buffering emitter follower stages Q10 and Q13. The frequency of oscillation is determined by the charging and discharging of a timing capacitor, $C_0$, through two sets of symmetrical current sources; $I_2$, $I_5$ and $I_3$, $I_6$. The output of the VCO is obtained from the collectors of Q11 and Q12 in the form of a symmetrical square wave with a peak amplitude swing of $V_{be}$ which is the base-emitter drop of the transistors of the circuit. In FIG. 2 these output terminals are designated B and D and represent the voltage $V_0(t)$, coupled to the phase comparator 10 of FIG. 1.

Diode connected transistors Q8 and Q9 serve as collector loads for Q11 and Q12 and thus make the output amplitude independent of the absolute values of the currents $I_2$ and $I_3$. The phase locked loop error voltage, $V_d$, is applied differentially to the control terminals E and F. This control voltage controls the frequency of oscillation by partitioning the total control current designated $I_T$ between the voltage controlled sources $I_1$, $I_2$ and $I_3$. Thus, the total current $I_T$ is in essence a common constant current source which is fed by a current divider network having the three legs $I_1$, $I_2$, $I_3$. $V_d$ as indicated by the polarity signs is coupled to current source $I_1$ in an opposite sense to $I_2$ and $I_3$ to thus differentially vary the current in an opposite sense. Thus, as indicated by the bracketed currents (I), the toal current $I_T$ is substantially always maintained at 4I with $I_1$ providing (2I) and $I_2$ and $I_3$, (I). This provides for temperature stability of the circuit. The foregoing differential technique is disclosed and claimed in a copending application entitled "Phase Locked Loop With Voltage Controlled Oscillator" filed Sept. 6, 1968, Ser. No. 758,040, in the name of Graham A. Rigby and assigned to the present assignee and now U.S. Pat. No. 3,582,809.

Current sources $I_4$ and $I_7$ provide biasing currents for the cascade connected transistors Q11 and Q12 of the multivibrator circuit Q10–Q13. A temperature dependent d.c. bias source between terminals H and J is designated $V_x(T)$. This is coupled to the constant current sources $I_5$ and $I_6$ which in turn are coupled to capacitor $C_0$. The bias source $V_x(T)$ causes sources $I_5$ and $I_6$ to have the same temperature dependence as $V_{be}$. To a first order approximation this makes the frequency of oscillation of the VCO independent of temperature since $$f_o = (I_2 + I_5/2\ C_0\ V_{be}) \tag{1}$$

More specifically, it can be shown by the following analysis that since the loop error voltage, $V_d$, only controls part of the frequency determining current source (that is, $I_1$, $I_2$ and $I_3$) and not the bias sources $I_5$ and $I_6$, the maximum frequency deviation for the VCO due to $V_d$ is limited to $$(\Delta f/f_o)\max = (I_2/I_2 + I_5) \tag{2}$$

Figure 4:
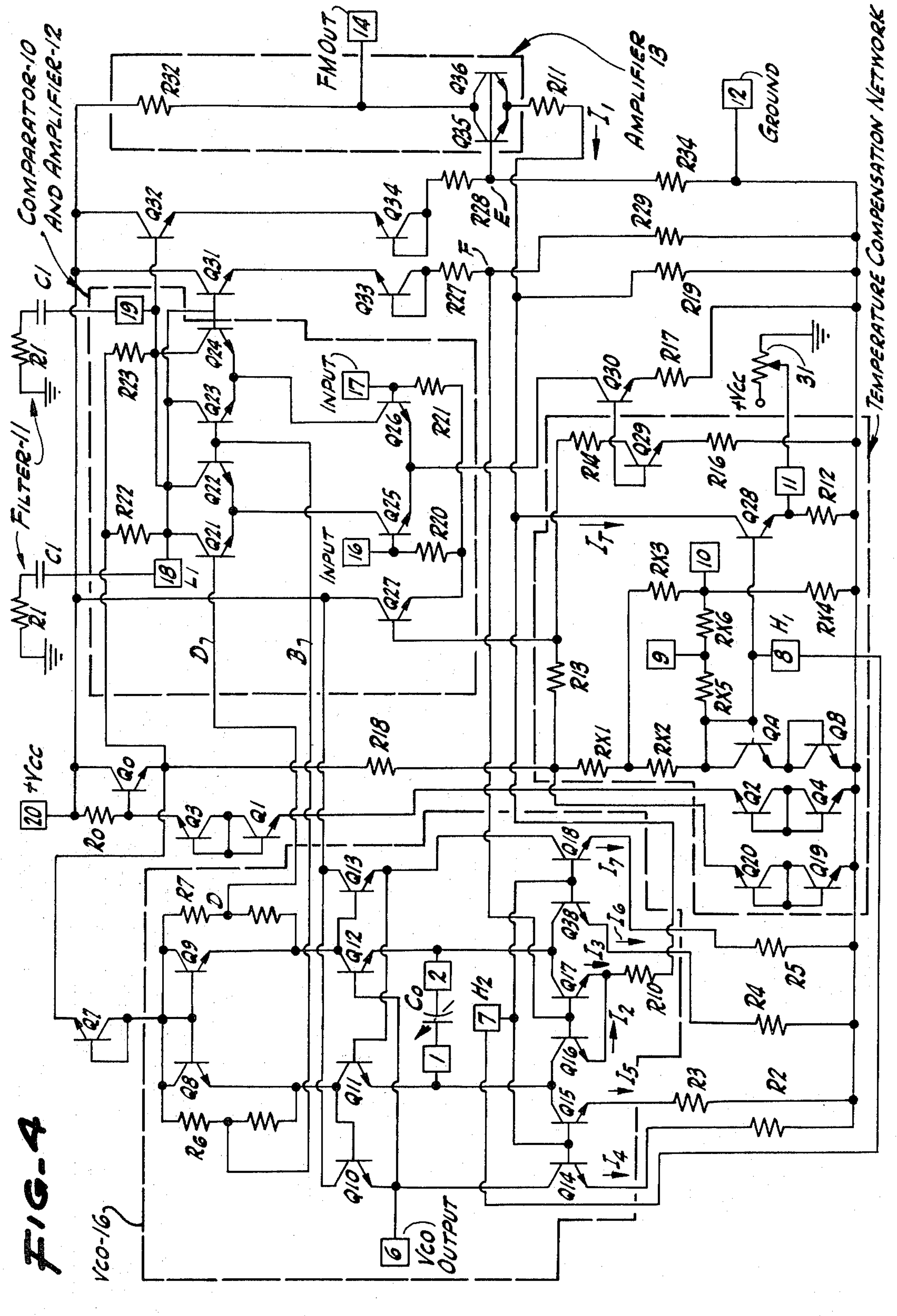
FIG. 4 is a detailed schematic circuit of FIG. 1.

In the above equation $\Delta f$ is the attempted deviation due to a change in $V_d, f_o$ is the approximate free running frequency of oscillation of the VCO and represents $V_o(t)$, and $I_2$ and $I_5$ are, of course, the respective variable current source and constant bias current source. Because of the symmetrical characteristic of the circuit, that is, $I_3 = I_2$ and $I_6 = I_5$ the other current sources need not be included in equation (2). It is also apparent from the above equation that the maximum deviation may be varied and thus the maximum tracking range of the circuit may be varied by controlling the maximum magnitude of $I_2$. More specifically, by varying the value of $I_2$, $\Delta f/f_o$ can be varied from 1% to 30% of $f_o$. this is accomplished by an external potentiometer which is illustrated in FIG. 4 and will be discussed below.

Figure 3:
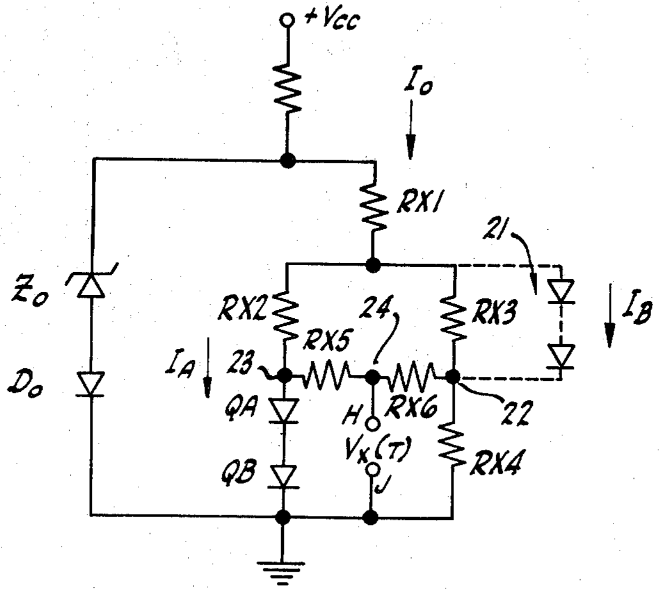
FIG. 3 is a simplified circuit diagram of a portion of FIG. 1.

To minimize the internal drifts of the VCO the current sources $I_5$ and $I_6$, which as discussed above in effect limit the tracking range of the VCO, are biased from the temperature compensated bias source $V_x(T)$. A simplified circuit of the temperature dependent network is illustrated in FIG. 3. Generally, semiconductor diodes have a fixed and well defined temperature drift of the diode turn on voltage which is very close to −2mv/°C. The circuit of FIG. 3 utilizing this well defined drift forms a balanced bridge arrangement such that the resistors $R_{X2}$, $R_{X3}$ and $R_{X4}$ are equal. Moreover, the balancing of the bridge is divided by setting the branch current $I_A$ through $R_{X2}$ and the diode connected transistors QA and QB equal to the branch current $I_B$ through resistor $R_{X3}$ and $R_{X4}$ and setting these currents equal to the function of the diode turn on voltage, $2\phi$, as $$I_A = I_B = (2\phi/R_{X2}) = (2\phi/\ R_{X4}) \tag{3}$$

With the two diode connected transistors, QA and QB, the current is therefore determined by both voltage drops, $2\phi$, across the transistors. The balanced bridge as illustrated in FIG. 3 also includes a center leg consisting of series connected resistors $R_{X5}$ and $R_{X6}$ which provide from a center tap the biasing voltage $V_x(T)$. Although only the $I_A$ branch of the bridge is shown as having a series diode means, QA and QB, as indicated by the dashed network 21 resistor $R_{X3}$ may be replaced by two similar diodes. This would have the effect of placing a positive temperature coefficient at the point 22 as opposed to the zero temperature coefficient with the two resistors $R_{X3}$ and $R_{X4}$. At the other connection 23 of the center leg between $R_{X2}$ and the diode connected transistors QA and QB the temperature coefficient is a −4mv/°C. This is as a result of the above mentioned definite temperature drift of the two diodes.

Because of the equality of the currents $I_A$ and $I_B$ the potentials at points 22 and 23 are equal. Thus, substantially no current flows through the center leg $R_{X5}$, $R_{X6}$. Thus, the voltage tap at point 24 is at this same voltage level as points 22 and 23 but by a proper choice of the resistors $R_{X5}$ and $R_{X6}$ its temperature coefficient can be made to vary from −4mv/°C to 0. In other words, with $R_{X5}$ reduced to zero resistance the temperature coefficient would be −4 or with $R_{X5}$ present and $R_{X6}$ at a zero resistance the tap would actually be at point 22 to provide for a 0 temperature coefficient. In addition, with the alternative circuit configuration of 21 substituted, point 22 would, of course, have a positive temperature coefficient of +4mv/°C. Thus, the persent temperature network can fully compensate for any type of device 16 to which it is coupled.

The circuit of FIG. 3 also includes an avalanche diode $Z_0$ and the diode $D_0$ series coupled between ground and $+V_{cc}$ to provide a temperature compensated reference voltage from which the constant current $I_0$ is provided independent of $+V_{cc}$ variations.

The actual circuit diagram of the phase locked loop of FIG. 1 along with the VCO and the temperature compensation network is shown in FIG. 4. The basic functional blocks with the circuit diagram which correspond to the blocks of FIG. 1 are identified with dashed lines. The rectangular numbered boxes correspond to actual pads which are present on the integrated circuit substrate. Thus, FIG. 4 is a representation of the actual integrated circuit of which a representative cross section is shown in FIG. 5.

Figure 5:
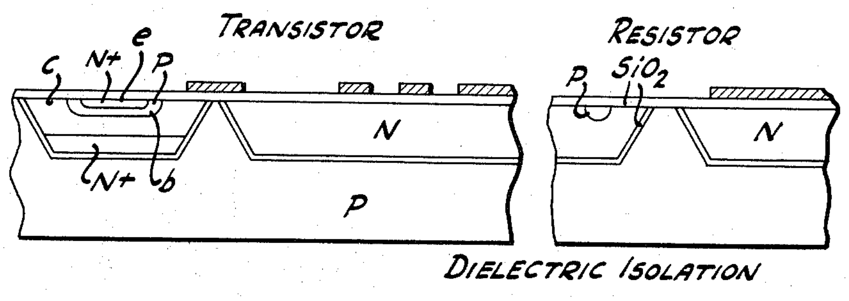
FIG. 5 is a typical cross section of FIG. 4 in integrated format.

Referring briefly to FIG. 5 there is illustrated a transistor with dielectric isolation which has been diffused in a P type substrate layer with the base emitter and collector indicated. The dielectric isolation is indicated by the silicon dioxide barrier. A typical resistor is also indicated by a single P type diffusion in the N layer which is also adjacent a dielectric barrier.

Referring now to the circuit of FIG. 4, all components shown on the drawing are integrated except those which are coupled to the pads. Specifically, variable capacitor $C_0$ is coupled to pads 1 and 2, filter 11 is coupled to pads 18 and 19 and the $+V_{cc}$ voltage supply source is coupled to pad 20, and the potentiometer control coupled to pad 11. The remainder of the circuit is integrated on a single substrate which has a dimension of 67 × 75 mills. In actual practice, dielectric isolation techniques are used as shown in FIG. 5. In addition, diffusion isolation using an epitaxial layer may also be used.

Comparator 10 and amplifier 12 (FIG. 1) have been combined in one block. Transistor Q30 provides a current source feeding the input transistors Q25 and Q26. The input signal is applied either differentially or single endedly into the input terminals coupled to the bases of the transistors designated pads 16 and pads 17. This signal controls the partitioning of the current from Q30 between the transistors Q25 and Q26. The inputs 16 and 17 of comparator 10 are internally biased from a regulated bias reference transistor Q27 through resistors R20 and R21. The output signal from the voltage controlled oscillator 16 appears on lines B and D which are coupled respectively to the bases of transistor pairs Q21, Q24 and Q22, Q23. The input on lines B and D is a sufficient amplitude to switch these transistor pairs on and off alternately. Filter 11 includes resistor-capacitors R1C1 of identical value and are respectively coupled to pads 18 and 19 which in turn are coupled to the transistor pairs. In operation when used as a phase detector, comparator 10 produces a differential error voltage output across the output terminals L1 and L2. This voltage is proportional to the cosine of the phase angle difference between the input signal at terminal 10 and the VCO output frequency.

The low pass filters formed by the capacitor C1 and resistor R1 are, as is apparent, external to the integrated circuit since they are coupled to pads 18 and 19. Since the circuit provides a differential output, one such low pass filter is needed for each output.

Referring now to the voltage controlled oscillator 16 which also for practical purposes includes the temperature compensation network so designated, the various bias current sources of the VCO, that is $I_4$, $I_5$, $I_6$ and $I_7$, are provided respectively by transistors Q14, Q15, Q38 and Q18. The controlled current sources $I_1$, $I_2$ and $I_3$ which control the VCO frequency as a function of the control voltage applied across the terminals E and F correspond for $I_1$ to transistors Q35 and Q36, for $I_2$, Q16 and for $I_3$, Q17.

The phase locked loop is completed by coupling the outputs L1 and L2 of the comparator 10 back to the inputs of the VCO on lines E and F through level shifting emitter followers Q31 and Q32 and avalanche diodes Q33 and Q34 and their associated series coupled resistors R27 and R28. During the level shift process, the error signal output of comparator 10 is attenuated by the resistor dividers formed by R27, R29 and R28, R30 of the level shift network.

The demodulated output for FM signals is taken at pad 14 through the output resistor R32.

Phase comparator 10 and VCO 16 are biased through an internal voltage regulator formed by the transistor $Q_0$ which is biased through a voltage reference strain consisting of transistors Q1 through Q4 which are all connected as diodes. Thus, the voltage at the resistors R22 and R23 of comparator 10 is fixed, for example at approximately 14 volts, independent of the power supply. Similarly, the positive voltage supplies of VCO 16 at the base of transistors Q8 and Q9 is obtained from the foregoing reference by means of the Zener connected transistor Q7.

The temperature compensation network which was shown in simplified form in FIG. 3 actually in addition to the center tap indicated by pad 9 between $R_{x5}$ and $R_{x6}$ includes a pad 8 connected to the left side of $R_{x5}$ and a pad 10 connected to the right side of $R_{x6}$. Thus, the temperature coefficient of the bias voltage of pads 8, 9 and 10 becomes progressively more positive for increasing pad numbers. In the present circuit, pad 8 designated $H_1$ is coupled to pad 7 designated $H_2$ of the central part of the VCO. Thus, a more negative temperature coefficient is thereby provided for this specific embodiment. However, depending on the circuit and the type of integration and other factors it may be necessary to use pads 9 or 10. However, this is not known before the circuit is constructed. Thus, in accordance with the present invention, the shifting from one temperature compensating coefficient to another may be made with no attendant voltage level shift.

Diode connected transistors Q19 and Q20 are equivalent to diode $D_0$ of FIG. 3. Zener conducting diode transistor $Q_0$ is equivalent to Zener diode $Z_0$ of FIG. 3.

As discussed above, see equation (2), the maximum tracking range of the VCO is, of course, limited by the ratio of $I_2$ and $I_5$. However, this maximum range may be electronically controlled by an external lock range control which is coupled to pad 11. This is shown as a potentiometer 31 which is coupled between ground and $+V_{cc}$ and has its movable contact coupled to the emitter of transistor Q28 which forms the current source $I_T$ for VCO 16. Current injected into this current source decreases the limiter threshold and consequently the VCO tracking range. Any current extracted from the node results in an increase of the limiter threshold.

Thus, the present invention has provided a VCO which finds special use in a phase locked loop which has limited and electronically controlled tracking range and temperature compensation.

I claim:

1. In a phase locked loop, a phase comparator for receiving an input signal and providing an output, filtering means coupled to the output of the phase comparator and providing a filtered output serving as a frequency control signal, and a voltage controlled oscillator coupled between the output of said filter means and the phase comparator said voltage controlled oscillator having a free running frequency of oscillation, said voltage controlled oscillator being responsive to the magnitude of said frequency control signal for producing an output signal having a frequency related to such magnitude of said frequency control signal, said voltage controlled oscillator including an input terminal and an output terminal, a multivibrator coupled between said input terminal and said output terminal for respectively receiving said frequency control currents, and producing said output signal, said multivibrator including first and second transistors, load means coupled to said first and second transistors, cross coupling means coupling said transistors to provide regenerative feedback between said transistors, said cross coupling means including a timing capacitor, means for charging the timing capacitor including a constant current source for supplying a constant current, $I_5$, to said timing capacitor to substantially determine said free running frequency of oscillation, $f_o$, and a variable current source for supplying a variable current, $I_2$, to said timing capacitor, the sum of said current, $I_2 + I_5$, determining said frequency of said output signal, said summed currents being alternately switched by said first and second transistors, means for controlling said variable current from said variable current source in accordance with said frequency control signal whereby the frequency deviation, $\Delta f$, of said output signal of said multivibrator is substantially independent of the free running frequency of oscillation of the multivibrator and means coupled to said variable current source for limiting, $I_2$, to a maximum value, $I_{2(MAX)}$, the maximum frequency deviation of said output signal being determined by $$(\Delta f/f_o\ _{MAX} = [I_{2(MAX)}/I_{2(MAX)} + I_5].$$

2. A phase locked loop as in claim 1 where substantially all components of the voltage controlled oscillator are integrated into a monolithic substrate.

* * * * *